United States Patent
Casey (10) Patent No.: US 8,451,576 B2
(45) Date of Patent: May 28, 2013

(54) SCR CIRCUIT FOR PROTECTING CENTRAL OFFICE END OF TELEPHONE LINE

(75) Inventor: Kelly C. Casey, Flower Mound, TX (US)

(73) Assignee: Littelfuse, Inc., Chicago, IL (US)

( * ) Notice: Subject to any disclaimer, the term of this patent is extended or adjusted under 35 U.S.C. 154(b) by 539 days.

(21) Appl. No.: 12/156,367

(22) Filed: May 30, 2008

(65) Prior Publication Data

US 2009/0296301 A1 Dec. 3, 2009

(51) Int. Cl.
*H02H 1/04* (2006.01)

(52) U.S. Cl.
USPC ........................................................ 361/119

(58) Field of Classification Search
USPC ........................................................ 361/119
See application file for complete search history.

(56) References Cited

U.S. PATENT DOCUMENTS

| | | | |
|---|---|---|---|
| 4,079,211 A | 3/1978 | Janssen | |
| 4,377,832 A | 3/1983 | Toney et al. | |
| 4,513,341 A | 4/1985 | Kollanyi | |
| 4,644,437 A | 2/1987 | Robe | |
| 4,653,084 A | 3/1987 | Ahuja | |
| 4,661,878 A | 4/1987 | Brown et al. | |
| 4,700,380 A | 10/1987 | Ahuja | |
| 4,710,949 A | 12/1987 | Ahuja | |
| 4,713,719 A | 12/1987 | Kugleman | |
| 4,758,920 A | 7/1988 | McCartney | |
| 4,849,846 A * | 7/1989 | Hung et al. | ............ 361/56 |
| 4,876,620 A | 10/1989 | Borkowicz | |
| 4,905,119 A | 2/1990 | Webb | |
| 4,991,051 A | 2/1991 | Hung | |
| 5,319,515 A | 6/1994 | Pryor et al. | |
| 5,428,494 A | 6/1995 | Ahuja | |
| 5,440,441 A | 8/1995 | Ahuja | |
| 5,479,031 A | 12/1995 | Webb et al. | |
| 5,516,705 A * | 5/1996 | Webb et al. | ............ 438/133 |
| 5,631,797 A | 5/1997 | Chabinec et al. | |
| 5,696,391 A | 12/1997 | Bernier | |
| 6,407,901 B1 | 6/2002 | Casey et al. | |
| 6,862,162 B2 | 3/2005 | Casey | |
| 6,882,514 B2 | 4/2005 | Mutunga et al. | |
| 6,922,323 B1 | 7/2005 | Bentley | |
| 7,019,338 B1 | 3/2006 | Ballon | |
| 2002/0075623 A1 * | 6/2002 | Maytum et al. | ............ 361/119 |

FOREIGN PATENT DOCUMENTS

GB 2184884 * 7/1987

OTHER PUBLICATIONS

A Switching Regulator and Ligntning Protector for a Subscriber Line Interface Circuit. IEEE Journal of Solid-State Circuits, vol. SC-21, No. 6, Dec. 1986.
TISP8250—Gated Unidirectional Overvoltage & Overcurrent Protector Product Brochure, Bourns, 2004.
Littelfuse Telecom Design Guide, Battrax Device, pp. 6-36 & 6-37, 2006.

* cited by examiner

*Primary Examiner* — Stephen W Jackson
*Assistant Examiner* — Tien Mai
(74) *Attorney, Agent, or Firm* — Kacvinsky Daisak PLLC (57) ABSTRACT

A protection circuit employing a pair of SCR devices connected respectfully from telephone line tip conductor and ring conductors to ground. The SCR devices are of the type providing internal semiconductor resistors between the gate and cathode terminals for sensing overcurrents in the telephone line conductors, and providing voltage sensitive semiconductor regions so that the SCR devices are sensitive to overvoltages on the telephone line conductors. A pair of diodes are connected across the cathode-anode terminals of the SCR devices to provide overvoltage protection for positive polarity overvoltages on the telephone line.

28 Claims, 3 Drawing Sheets

SCR CIRCUIT FOR PROTECTING CENTRAL OFFICE END OF TELEPHONE LINE

RELATED APPLICATION

This non-provisional patent application relates to U.S. non-provisional patent application entitled "SCR Circuit For Protecting Customer End Of Telephone Line," filed even date herewith, and identified by Ser. No. 12/156,168.

TECHNICAL FIELD OF THE INVENTION

The present invention relates in general to telephone line protection circuits and techniques, and more particularly to such type of circuits employing gated unidirectional thyristor devices.

BACKGROUND OF THE INVENTION

Telephone lines, like other types of electrical conductors, are subject to electrical interference which can damage circuits connected to such conductors. By necessity, telephone lines are located outside buildings and are subject to lightning strikes, AC power line crosses and other electrical interferences. The electrical energy coupled to a telephone line, whether it be a lightning strike or an AC power line cross, is substantial and can be sufficient to damage electrical circuits connected to the lines unless such lines are provided with protection. Telephone line protection techniques generally include a primary protection that protects down line circuits from large voltages, generally greater than about 1,000 volts. The primary telephone line protectors include gas discharge tubes, carbon blocks and other similar devices, all of which discharge the damaging energy to the earth. Secondary protection of telephone lines is provided and includes a vast variety of semiconductor circuits for protecting the telephone line conductors from overcurrent condition and overvoltage conditions after the voltage and current have been limited by the primary protection elements.

Since telephone lines extend between the subscriber premises and the central office, protection is also required in the central office for protecting the electrical circuits therein, and especially the subscriber line interface circuits (SLIC). The secondary protection schemes differ as between the subscriber premises and the central office, as there is generally no electrical ground present in the telephone equipment connected to the telephone line at the subscriber premises, while the central office telephone equipment does provide an electrical ground to which the secondary protection circuits are referenced. Thus, the secondary subscriber line protection circuits designed for the customer premises generally provide protection between the tip and ring conductors themselves, rather than between the tip and ring conductors to ground.

The prior art includes a host of designs for customer premises end protection circuits. Some protection circuits provide overvoltage protection, but not overcurrent protection, and vice versa. Some designs include many components, including complicated bipolar and FET transistor circuits. Other protection circuits include SCRs and triacs which, when triggered, clamp the overvoltage to a safe level between the telephone line conductors.

Another concern with the design of protection circuits using semiconductor components is that such devices must withstand the overvoltages and overcurrents to which they are subjected. The junctions of such semiconductor devices and the area of the various semiconductor regions must be designed to withstand the maximum operating voltages and currents, which can often range from 500-1,000 volts, and 10 amps or greater. Standard specifications exist in the telephone industry for the maximum surge voltage and surge current conditions such circuits must accommodate, in response to a specified high voltage transient of a standard duration.

Some protection circuits employ semiconductor devices in series with the telephone line conductors. While this might facilitate the sensing and shunting of overvoltages and overcurrents on the telephone line, the nonlinear characteristics of such devices, especially if the communication signals must pass through semiconductor junctions, is highly undesirable. The telephone equipment designers have become accustomed to designing equipment with the understanding that the telephone line protection circuits are generally resistive when operating in the talk mode. The interposition of semiconductor junctions in series with a telephone line conductor presents a nonlinear condition to signals of different amplitudes, and thus may deteriorate the telephone line characteristics initially relied upon by the designers.

Telephone circuits generally operate using only negative voltages to avoid corrosion of grounding conductors. Some systems use voltages with positive excursions during ringing conditions, but many even restrict ringing signals to negative voltages. As such, it is the normal condition for the central office SLIC circuits to sink current into the high potential terminals and only source current from the low potential terminals. Typically, the −48 volt drive of the SLIC circuit sinks current from the ring conductor of a telephone line, and the zero volt, or near zero volt, drive of the SLIC circuit sources current to the tip conductor of the telephone line. The SLIC drive circuits that drive the telephone line with DC currents are often referred to as the central office battery, while in practice the drive circuits are semiconductor amplifiers or drivers.

There are protection circuits that compare the telephone line voltage to the central office battery voltage. These protection circuits, known as "battery tracking" circuits, assume that if the line voltage is more negative than the battery voltage, then the SLIC circuit must be sourcing current from the high potential terminal, whereupon the protection devices are activated. This assumption may often be erroneous, thus allowing abnormal operation without activating the protection devices.

From the foregoing, it can be seen that there is a need for a protection circuit that is highly effective to suppress overvoltages and/or overcurrents on the customer end of a telephone line, or other set of conductors, has few components, and is simple in design. Another need exists for a subscriber line protection circuit that is placed in series with the telephone line conductors, but which does not introduce nonlinear characteristics into the line. Yet another need exists for a protection circuit that senses when current is sourced by the central office battery, and prevents the same.

SUMMARY OF THE INVENTION

In accordance with the principles and concepts of the invention, there is disclosed a protection circuit employing SCR devices cross coupled between a pair of conductors to provide overvoltage and overcurrent protection to such conductors. When used in conjunction with telephone line conductors, the unidirectional conducting feature of the SCR devices prevents the central office SLIC circuits from sourcing current in response to a negative overvoltage on the telephone line.

In accordance with a feature of the invention, when used in conjunction with a telephone line employing a very low impedance transformer, or other low impedance device, located at the customer premises end, the resistance of the gate-cathode resistor of one SCR device, added to the resistance of the transformer winding, provides sufficient series resistance for the other SCR device to respond to an overvoltage or overcurrent and enter a reliable latched state in which the overcurrent and /or overvoltage is shunted around the transformer winding.

In accordance with another feature of the invention, the protection circuit includes cross-coupled SCR devices connected in a pair of conductors so that the current passes in series between the cathode and gate terminals of the SCR devices, and where during normal operation in which the SCR devices are not conducting, the conductors are presented with resistive characteristics of the SCR devices, and not semiconductor junction nonlinearities.

In accordance with another aspect of the invention, the customer end telephone line protection circuit need only include a pair of dual function SCR devices, which can both be integrated into the same integrated circuit chip, thereby much simplifying the protection circuit that provides protection against both overvoltage and overcurrent conditions.

In accordance with yet another feature of the invention, the central office end telephone line protection circuit need only include a pair of dual function SCR devices, together with two diodes, all of which can be integrated into the same integrated circuit chip, thereby much simplifying the protection circuit that provides protection against both overvoltage and overcurrent conditions.

According to yet another feature of the invention, disclosed is a method of fabricating a pair of gated unidirectional thyristor devices, together with semiconductor gate-cathode current sensing resistances, to thereby provide matched thyristor device characteristics, as well as matched resistance values. With matched resistance values provided with the protection circuits, the longitudinal balance of a telephone line in which the current sensing resistances are inserted, is maintained balanced. Different overcurrent thresholds can be achieved by bridging a discrete resistor across the gate and cathode terminals of the gated unidirectional thyristor devices.

According to one embodiment of the invention, disclosed is a method of protecting an electrical circuit from overcurrents and overvoltages, where the electrical circuit is connected between a first conductor and a second conductor. The method includes providing a first current sensing resistor for connection in series with the first conductor, and a second current sensing resistor for connection in series with the second conductor. A first gated unidirectional thyristor is provided with a gate terminal, a cathode terminal and an anode terminal. Similarly, a second gated unidirectional thyristor is provided with a gate terminal, a cathode terminal and an anode terminal. Current passing through the first resistor is sensed to develop a corresponding voltage across the first resistor, where the current passing through the first resistor also passes through the first conductor. The voltage across the first resistor is applied between the gate terminal and the cathode terminal of the first gated unidirectional thyristor. A current passing through the second resistor is sensed to develop a corresponding voltage across the second resistor, where the current passing through the second resistor also passes through the second conductor. The voltage across the second resistor is applied between the gate terminal and the cathode terminal of the second gated unidirectional thyristor. If an overcurrent flowing in the first conductor is greater than a first predetermined threshold and flowing in a first direction in the first conductor, the corresponding voltage across said first resistor is used to forward bias the first gated unidirectional thyristor into conduction to thereby shunt the overcurrent from the first conductor to the second conductor via the cathode terminal and the anode terminal of the first gated unidirectional thyristor. If an overcurrent flowing in the first conductor is greater than the first predetermined threshold but flowing in a second direction in the first conductor, the corresponding voltage across the first resistor is used to reverse bias the first gated unidirectional thyristor and prevent conduction between the cathode terminal and the anode terminal of the first gated unidirectional thyristor. If an overcurrent flowing in the second conductor is greater than a second predetermined threshold and flowing in a first direction in the second conductor, the corresponding voltage across said second resistor is used to forward bias the second gated unidirectional thyristor into conduction to thereby shunt the overcurrent from the second conductor to the first conductor via the cathode terminal and the anode terminal of the second gated unidirectional thyristor. If an overcurrent flowing in the second conductor is greater than the second predetermined threshold but flowing in a second direction in the second conductor, the corresponding voltage across the second resistor is used to reverse bias the second gated unidirectional thyristor and prevent conduction between the cathode terminal and the anode terminal of the second gated unidirectional thyristor.

According to another embodiment of the invention, disclosed is a method of protecting a circuit connected to a communication line having a pair of conductors. The method includes connecting a gate-cathode resistance of a first SCR device in series with a tip conductor of the communication line, and connecting a gate-cathode resistance of a second SCR device in series with a ring conductor of the communication line. A low impedance device is connected in series with the tip and ring conductors, and in series with the gate-cathode resistances of the first and second SCR devices. The method also provides for connecting an anode of the first SCR device to the ring conductor and to the cathode of the second SCR device, and connecting an anode of the second SCR device to the tip conductor and to the cathode of the first SCR device. In response to an overcurrent on the communication line tip conductor, a gate of the first SCR device is forward biased to drive the first SCR device into conduction, and the overcurrent maintains the second SCR device in cutoff. The gate-cathode resistance of the second SCR device provides a load resistance together with resistance of the low impedance device to allow the first SCR device to be driven into a latched conductive state.

According to another embodiment of the invention, disclosed is a protection circuit for protecting a telephone line circuit connected to a tip conductor and a ring conductor. The protection circuit includes a first and second unidirectional thyristor, where each first and second thyristor has a gate, cathode and anode. The first and second unidirectional thyristors each have a gate-cathode resistance formed in a semiconductor chip in which the respective thyristors are constructed. A cathode and anode of the first unidirectional thyristor are connected to couple the tip and ring conductors together when the first unidirectional thyristor is driven into conduction. A cathode and anode of the second unidirectional thyristor are connected to couple the tip and ring conductors together when the second unidirectional thyristor is driven into conduction. The gate-cathode resistances of the first and second unidirectional thyristors are connected in series with the respective telephone line tip and ring conductors and in series with the telephone line circuit to be protected. The gate-cathode resistances are arranged so that when a series current flows in one direction in the telephone tip and ring conductors, a gate of the first thyristor is forward biased by the series current, and a gate of the second thyristor is reverse biased by the series current. The first and second unidirectional thyristors are each constructed with buried regions to define respective cathode-anode breakover voltages so that an overvoltage on the telephone tip or ring conductor causes a respective first or second thyristor to be driven into conduction irrespective of a gate current.

With regard to the foregoing embodiment, the protection circuit is connected to a telephone line and is adapted for protecting customer premises equipment. Further included is a central office protection circuit connected to the telephone line for protecting central office circuits. The central office protection circuit includes a first and second unidirectional thyristor, where each unidirectional thyristor includes a gate, cathode and anode. The first and second unidirectional thyristor each include voltage sensitive semiconductor regions responsive to a breakover voltage between the respective cathodes and anodes thereof for driving the first and second unidirectional thyristors into conduction. A cathode of the first unidirectional thyristor is adapted for connection to a tip input of the central office circuits, and a cathode of the second unidirectional thyristor is adapted for connection to a ring input of the central office circuits. The anodes of the first and second unidirectional thyristors are connected to ground. A gate of the first unidirectional thyristor is connected to the tip conductor of the SLIC equipment, and a gate of the second unidirectional thyristor connected to the ring conductor of the SLIC equipment. First and second diodes are included, where the first diode has an anode connected to the tip conductor, and the second diode has an anode connected to the ring conductor. The cathodes of the first and second diodes are connected to ground.

According to another embodiment of the invention, disclosed is a method of protecting an electrical circuit from overcurrents, where the electrical circuit is connected between a first conductor and a second conductor. Provided is a first current sensing resistance for connection in series with the first conductor, and a second current sensing resistance for connection in series with the second conductor. A first gated unidirectional thyristor is provided with a gate terminal, a cathode terminal and an anode terminal, and a second gated unidirectional thyristor is similarly provided with a gate terminal, a cathode terminal and an anode terminal. Current passing through the first resistance is sensed to develop a corresponding voltage across the first resistance, where the current passing through the first resistance also passes through the first conductor. The voltage across said first resistance is applied between the gate terminal and the cathode terminal of the first gated unidirectional thyristor. Current passing through said second resistance is sensed to develop a corresponding voltage across the second resistance, where the current passing through the second resistance also passes through the second conductor. A voltage across the second resistance is applied between the gate terminal and the cathode terminal of the second gated unidirectional thyristor. If an overcurrent flowing in the first conductor is greater than a first predetermined threshold and flowing in a first direction in the first conductor, the corresponding voltage across said first resistance is used to forward bias the first gated unidirectional thyristor into conduction to thereby shunt the overcurrent from the first conductor via the cathode terminal and the anode terminal of the first gated unidirectional thyristor. If an overcurrent flowing in the first conductor is greater than the first predetermined threshold but flowing in a second direction in the first conductor, the corresponding voltage across said first resistance is used to reverse bias the first gated unidirectional thyristor and prevent conduction between the cathode terminal and the anode terminal of the first gated unidirectional thyristor. If an overcurrent flowing in the second conductor is greater than a second predetermined threshold and flowing in a first direction in the second conductor, the corresponding voltage across said second resistance is used to forward bias the second gated unidirectional thyristor into conduction to thereby shunt the overcurrent from the second conductor via the cathode terminal and the anode terminal of the second gated unidirectional thyristor. If an overcurrent flowing in the second conductor is greater than the second predetermined threshold but flowing in a second direction in the second conductor, the corresponding voltage across said second resistance is used to reverse bias the second gated unidirectional thyristor and prevent conduction between the cathode terminal and the anode terminal of the second gated unidirectional thyristor.

According to yet another embodiment of the invention, disclosed is a protection circuit for protecting a telephone line circuit connected to a tip conductor and a ring conductor, where the protection circuit includes a first and second unidirectional thyristor, and each of the first and second thyristors have a gate, cathode and anode. The first and second unidirectional thyristors each have a gate-cathode resistance formed in a semiconductor chip in which the respective thyristors are constructed. A cathode and anode of the first unidirectional thyristor are connected to couple the tip conductor to ground when the first unidirectional thyristor is driven into conduction. A cathode and anode of said second unidirectional thyristor are connected to couple the ring conductor to ground when the second unidirectional thyristor is driven into conduction. The gate-cathode resistances of the first and second unidirectional thyristors are connected in series with the respective telephone line tip and ring conductors and in series with the telephone line circuit to be protected. The gate-cathode resistances are arranged so that when a series current flows in one direction in the telephone tip and ring conductors, a gate of the first thyristor is forward biased by the series current and a gate of the second thyristor is reverse biased by the series current. A first diode has an anode connected to the cathode of the first gated unidirectional thyristor, and the first diode has a cathode connected to an anode of the first gated unidirectional thyristor. The first diode provides overvoltage protection for positive polarity overvoltages. A second diode has an anode connected to the cathode of the second gated unidirectional thyristor, and the second diode having a cathode connected to an anode of the second gated unidirectional thyristor. The second diode provides overvoltage protection for positive polarity overvoltages.

With regard to yet another embodiment of the invention, disclosed is a protection circuit for protecting a telephone line circuit connected to a tip conductor and a ring conductor. The protection circuit includes a first and second unidirectional thyristor, where each unidirectional thyristor has a gate, cathode and anode. The unidirectional thyristors each have a gate-cathode resistance formed in a semiconductor chip in which the respective thyristors are constructed. A cathode and anode of the first unidirectional thyristor is connected to couple the tip conductor to ground when the first unidirectional thyristor is driven into conduction. A cathode and anode of the second unidirectional thyristor is connected to couple the ring conductor to ground when the second unidirectional thyristor is driven into conduction. The gate of the second gated unidirectional thyristor is adapted for connection to a negative voltage SLIC driver. The gate-cathode resistance of the first and second unidirectional thyristors is connected in series with the respective telephone line tip and ring conductors and in series with the telephone line circuit to be protected. The gate-cathode resistances are arranged so that when a series current flows in one direction in the telephone line tip and ring conductors, the gate of the first thyristor is forward biased by the series current and the gate of said second thyristor is reverse biased by the series current. The first and second unidirectional thyristors are each constructed with buried regions to define respective cathode-anode breakover voltages so that an overvoltage on the telephone tip or ring conductor causes a respective first or second gated unidirectional thyristor to be driven into conduction irrespective of a gate current. A first diode has an anode connected to the cathode of the first gated unidirectional thyristor, and the first diode has a cathode connected to the anode of the first gated unidirectional thyristor. The first diode provides overvoltage protection for positive polarity overvoltages. A second diode has an anode connected to the cathode of the second gated unidirectional thyristor, and the second diode has a cathode connected to the anode of the second gated unidirectional thyristor. The second diode provides overvoltage protection for positive polarity overvoltages.

BRIEF DESCRIPTION OF THE DRAWINGS

Further features and advantages will become apparent from the following and more particular description of the preferred and other embodiments of the invention, as illustrated in the accompanying drawings in which like reference characters generally refer to the same parts, functions or elements throughout the views, and in which.

DETAILED DESCRIPTION OF THE INVENTION

Figure 1:
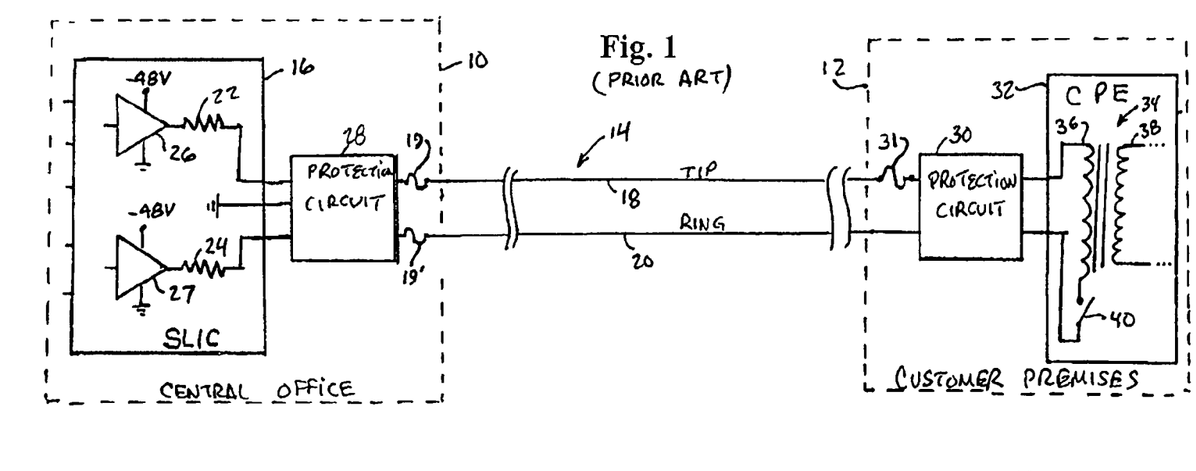
FIG. 1 is a drawing illustrating the conventional interconnections between a central office and a subscriber of telephone service.

With reference to FIG. 1, there is shown a diagram of the termination of a standard telephone line 14 at both the central office 10 and the customer premises 12. The telephone central office 10 includes a subscriber line interface circuit (SLIC) 16, shown in much simplified form, that provides an interface between the telephone line 14 and the other switching equipment (not shown) of the central office 10. There is generally one SLIC 16 for each twisted pair telephone line 14. The telephone line 14 includes a tip conductor 18 and a ring conductor 20. In practice, the SLIC 16 includes a pair of feed resistors 22 and 24, nominally of about 100-200 ohm, to provide protection to the SLIC circuits 16 if the tip conductor 18 and the ring conductor 20 become short circuited together. The office battery is nominally of a voltage of about −48 volts, and ranges between about 50-52 volts. The SLIC 16 may include many other circuits, including a 2w/4w hybrid circuit, line current sensing circuits, loop supervision circuits, battery feed circuits, etc. While there are a host of SLIC circuit designs, the SLIC circuit 16 typically includes a driver 26 that provides a near zero volt drive to the tip conductor 18 of the telephone line 14. Another driver 27 in the SLIC circuit 16 provides a −48 volt drive to the ring conductor 20 of the telephone line 14. As noted above, the −48 volt driver 27 is not generally equipped to source current, in response to large negative overvoltages, to the ring conductor 20. Should this occur, the −48 volt driver 27 tends to appear as a load rather than a source of power.

As the telephone line 14 enters the central office 10, there is provided a protection circuit 28 that provides secondary overvoltage protection to the SLIC 16 from foreign voltages inadvertently coupled to the telephone line 14 by lightning strikes, AC power line crosses, induced voltages, etc. Many protection circuits 28 also provide overcurrent protection so that the circuits of the SLIC are not damaged by excessive currents imposed on the telephone line 14. As noted in FIG. 1, the protection circuit 28 is ground referenced so that overvoltages on the telephone line 14 can be clamped to a safe level with respect to ground. Similarly, excessive currents carried on the telephone line 14 can be shunted to ground. The telephone line conductors 18 and 20 are protected from sustained overcurrents by the use of special fuses 19 and 19' that are surge tolerant, meaning that current surges on the telephone line 14 that may otherwise be damaging to the SLIC circuits 16, will not blow the fuses 19 and 19'.

The various supervision signals applied to the telephone line 14 by the SLIC 16, as well as the drive DC voltage, and the voice or data signals, are transmitted on the tip and ring conductors 18 and 20 to the destination, for example to the customer premises 12. A protection circuit 30 is provided at the customer premises 12 to provide protection to the customer premises equipment (CPE) 32 from overvoltages and overcurrents imposed on the telephone line 14. Importantly, the protection circuit 30 located at the customer premises 12 is not referenced to ground, as a ground potential is not carried via a wire from the central office 10 to the customer premises 12. A surge tolerant fuse 31 is provided in the tip conductor 18 to protect the telephone line 14 and the customer premises equipment 32 from sustained overcurrents. The customer premises equipment 32 includes a number of circuits, often a transformer 34 having a primary 36 and a secondary 38. The transformer secondary 38 couples the talking signals, data signals and other supervision signals to other CPE circuits for processing the same to complete a telephone line circuit between the central office 10 and the telephone equipment located at the customer premises 12. Shown in FIG. 1 is a telephone hook switch 40 for closing the telephone line circuit when the telephone, or other customer equipment, is placed in an off-hook condition.

Customer Premises End Protection

Figure 2:
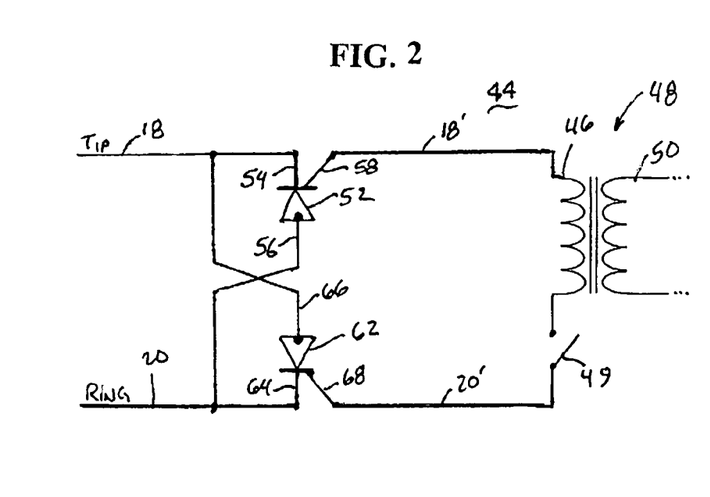
FIG. 2 is a schematic drawing of one embodiment of an overvoltage and overcurrent circuit for protecting subscriber premises equipment.

With reference to FIG. 2, there is illustrated a subscriber end protection circuit 44 constructed according to one embodiment of the invention. Typically, but not always, the telephone line tip conductor 18 and ring conductor 20 are coupled to the primary 46 of a circuit that emulates a transformer 48. While the operation of the protection circuit 44 is described herein in terms of use on a telephone line 14 terminated with a transformer 48, many other devices and circuits can be used for telephone line terminations. The secondary 50 of the transformer 48 is coupled to downline circuits that receive the signaling currents, voice signals or data signals and process the signals to produce corresponding communication information. The transformer primary 46, or low impedance device or circuit, may be on the order of a few ohms resistance, up to several hundred ohms. A hook switch 49 is symbolically shown connected in the primary circuit of the transformer 48. It should be understood that the principles and concepts of the invention will function as intended if the subscriber circuits are other than illustrated in FIG. 2. As noted in FIG. 2, no ground reference is available for use by the protection circuit 44.

The protection circuit 44 includes a first gated unidirectional thyristor 52, which can be an SCR, with a cathode 54 connected to the incoming tip conductor 18. An anode 56 of the SCR 52 is connected to the incoming ring conductor 20. The gate 58 of the SCR 52 is connected to the downline tip input 18' of the customer premises equipment 32, which wire is not metallically a part of the incoming tip conductor 18. Rather, the cathode/gate terminals 54, 58 of the SCR 52 are in series with the tip conductor 18 and the tip input 18'. Thus, any current that passes between the tip conductor 18 and the tip input 18' passes through the cathode/gate terminals 54 and 58 of the SCR 52. As will be described below, a semiconductor resistor or resistance is preferably formed in the SCR chip so that the current carried by the tip conductor 18 passes through the gate/cathode resistor of SCR 52.

The protection circuit 44 also includes a second gated unidirectional thyristor 62, which can be an SCR, with a cathode 64 connected to the incoming ring conductor 20. An anode 66 of the SCR 62 is connected to the incoming tip conductor 18. The gate 68 of the SCR 62 is connected to the downline ring input 20' of the customer premises equipment 32, which wire is not metalically a part of the incoming ring conductor 20. Rather, the cathode/gate terminals 64, 68 of the SCR 62 are in series with the ring conductor 20 and the ring input 20'. Thus, any current that passes between the ring conductor 20 and the ring input 20' passes through the cathode/gate terminals 64 and 68 of the SCR 62. A semiconductor resistor is preferably formed in the SCR chip so that the current carried by the ring conductor 20 passes through the gate/cathode resistor of SCR 62.

The SCR devices 52 and 62 are preferably constructed so that they are responsive to overvoltages between the respective anodes and cathodes to overcome corresponding breakover voltages ($V_{BO}$) and be driven into a conduction state, irrespective of the gate drive current. In other words, and different from conventional SCR devices, the SCR devices 52 and 62 can be driven into a conduction state simply by the exposure of an overvoltage between the anode and cathode terminals of such devices. The overvoltage sensitive nature of the SCR devices 52 and 62 is denoted with a solid dot in the triangular symbol, near the anode.

The SCR 52 can be driven into conduction according to a second mechanism, namely by an overcurrent flowing in the tip conductor 18. Moreover, the overcurrent flowing in the tip conductor 18 must flow in a specified direction in order to drive the SCR 52 into conduction. This is in contrast to a triac device, where gate currents of either polarity can turn on such type of bidirectional device, and pass currents in a bidirectional manner between the cathode and anode terminals. An SCR, on the other hand, is a unidirectional device which passes current only one direction between the anode and cathode terminals. As noted above, the SCR 52 is constructed with a semiconductor resistor formed between the gate 58 and the cathode 54. The value of the resistor can be selected during design and processing to provide a junction turn-on voltage when a specified magnitude of current flows in the tip conductor 18. The threshold current under which the SCR 52 will not turn on should be the higher than the current normally carried in the telephone line circuit under normal operating conditions. Typically, the highest current carried on the telephone line circuit is often about 150 ma. Thus, the internal resistor in both of the SCR devices 52 and 62 can have a value so that when 150 ma passes therethrough, the device will not be forward biased. The internal gate-cathode resistor of both SCR devices 52 and 62 is preferably the same value, but is not required to be the same value. In the example, the internal resistors can be less than about five ohm. The holding current of the SCR devices 52 and 62 should be above the nominal 150 ma line current so that when normal operation of the telephone line resumes, the SCR devices 52 or 62 can no longer sustain the latched condition. In any event, when a sufficient magnitude of current defining an overcurrent, such as 250 ma, flows through the semiconductor resistor of SCR device 52, in the correct direction (to the left in the tip conductor 18 of FIG. 2), the gate/cathode junction is forward biased and the SCR 52 is driven into conduction to thereby shunt the overcurrent from the ring conductor 20 to the tip conductor 18 via the anode 56 and cathode 54 of the SCR 52. The overcurrent is thus shunted around the primary 46 of the transformer 48. The other SCR 62 is driven into conduction by an overcurrent that flows in the ring conductor 20, to the left in the drawing, namely from the gate 68, through the internal semiconductor resistor of the SCR 62, and out of the cathode terminal 64. The overcurrent is thus shunted around the primary 46 of the transformer 48 by the protection circuit 44. As can be appreciated, when an overcurrent flows in the direction described, such current flows into the −48 volt driver 27, shown in FIG. 1. This direction of current flow is acceptable as this is the normal flow of battery current and thus deterioration of the battery is avoided. It is understood in the telephony field, that standard designs require that current does not intentionally flow out of the −48 volt driver 27 of the SLIC circuit 16.

It should be appreciated that with the configuration of the SCR devices 52 and 62 illustrated in FIG. 2, current flow in the telephone line circuit in one direction that exceeds the threshold of what is considered to be an overcurrent will forward bias the SCR device 52 into conduction, but will not forward bias the other SCR device 62 into conduction. In other words, SCR device 62 will be further reverse biased. Conversely, when an overcurrent flows in the telephone line circuit in the opposite direction, the SCR device 62 and will be forward biased into conduction and the other SCR device 52 will be further driven into cutoff. Both SCR devices 52 and 62 are preferably identically constructed and operate identically, but are connected in the series telephone line circuit in such a manner that both SCR devices 52 and 62 are not forward biased at the same time by the same current flowing in the telephone line circuit.

It can be appreciated from the configuration of the SCR devices 52 and 62 of FIG. 2, when the hook switch 49 is open (the telephone apparatus is on hook and not operating), the telephone line circuit is open circuited and thus no current can flow therein, including induced overcurrents. However, the telephone line 14 is still subject to overvoltage surges coupled to the telephone line conductors 18 and 20. Such overvoltages can damage the central office equipment, and in some instances be coupled through the transformer 48 and damage the customer premises equipment 32. Should a positive polarity overvoltage occur on the tip conductor 18, the SCR 62 will be driven into conduction because the breakover voltage of such device 62 will be exceeded, thus clamping the positive polarity overvoltage to the ring conductor 20. In the event a positive overvoltage is coupled to the ring conductor 20, the breakover voltage of the SCR 52 will be exceeded and such voltage will be clamped to a safe level with respect to the tip conductor 18. The same analysis can be carried out with regard to negative polarity overvoltages occurring on the tip and ring conductors 18 and 20.

A different situation exists when using the SCR arrangement illustrated, when the hook switch 49 is closed. This situation would exist when the customer premises telephone apparatus has been placed in the off-hook condition and the apparatus is in use, such as when voice or data communications are carried out using the telephone line 14. In this situation, if a positive overvoltage exists on the tip conductor 18, the resulting overcurrent would flow through the cathode-gate circuit of the SCR device 52 in a direction that does not turn on the SCR device 52. The overcurrent on the tip conductor 18 is briefly carried through the transformer primary 46 and through the gate-cathode circuit of the SCR device 62, which is in a direction to forward bias the gate-cathode junction and drive such device 62 into conduction. When the SCR 62 is driven into conduction, the tip conductor overcurrent is shunted to the ring conductor 20, thus bypassing the low impedance primary 46 of the transformer 48. A similar analysis can be carried out to understand that positive polarity overcurrents carried by the ring conductor 20 cause the SCR device 52 to be forward biased into conduction, thus shunting such currents around the transformer primary 46. Of course, a negative polarity overcurrent in the tip conductor 18 causes the SCR device 52 to be forward biased into conduction to also shunt such currents around the transformer 48. This overcurrent protection occurs irrespective of the particular device connected across the tip and ring conductors 18 and 20 in the customer premises equipment 32

In connection with the foregoing, the utilization of gated unidirectional thyristor devices is highly advantageous. In addition, the use of gated unidirectional thyristor devices overcomes the traditional problems of using triac devices, as triac devices are difficult to construct so as to maintain control and symmetric operation in all four quadrants. The gated unidirectional thyristor device, on the other hand is a single quadrant device, and is much easier to fabricate. Indeed, it is generally much more cost effective to construct a pair of gated unidirectional thyristor devices than to construct a single triac. Because the construction of triac devices is more challenging, there also exists the problem of fabricating triacs in different chips that have matched characteristics. Triac devices utilize an asymmetric gating structure for positive and negative currents. As such, it is more difficult to obtain matched characteristics in triac devices. As noted above, it is advantageous to obtain closely matched gate-cathode resistances to maintain the longitudinal balance of the telephone line. While an SCR device is an example of one type of gated unidirectional device that is well adapted for use with the various embodiments of the invention, other similar devices may be utilized with equal effectiveness.

In accordance with another feature of the invention, when the protection circuit 44 is employed with customer premises equipment involving a low impedance device, or a transformer, such as transformer 48, the arrangement facilitates the use of SCR devices coupled across a low impedance transformer, which otherwise may result in unreliable overcurrent protection. In the event an overcurrent condition exists in the telephone line circuit, and when utilizing a low impedance device such as a transformer, it is especially important that overcurrent protection is available, and that the protection circuit is reliable. As is well known, it is difficult to drive an SCR into a reliably latched state when coupled across a low impedance load. This is because it is difficult to achieve an SCR gain that exceeds unity so that the four layer structure enters the regenerative latched state. This shortcoming of the use of SCR devices protecting low impedance loads is realized when the device is operating in a mode in which the gate is triggered by a current in an attempt to drive the device into conduction. The shortcoming is not present when employing a voltage sensitive SCR device that experiences an overvoltage across the cathode and anode terminals, in which event the gate current is of less significance. The SCR arrangement of the invention overcomes this well-recognized problem in the following manner.

As noted above, each SCR device 52 and 62 includes an internal semiconductor resistor in series between the gate and cathode terminals. Should one SCR device, such as SCR 52, experience an overcurrent such that the gate-cathode structure is forward biased, then the internal resistor of the other SCR device 62 will add to the resistance of that of the transformer primary 46, thus facilitating turn on of the SCR device 52 experiencing the overcurrent. Stated another way, by adding the resistance of the reverse biased gate structure to the low resistance of the transformer primary, the SCR device being driven into conduction is more readily driven into a reliable latched state. Both SCR devices 52 and 62 can thus be reliably driven into a latched state (not at the same time) in response to an overcurrent, by relying on the internal resistor of the other SCR device. Again, the internal semiconductor resistors of the SCR devices can be tailored during design and fabrication to provide the overcurrent protection necessary to protect a transformer having a given primary current rating.

Figure 3:
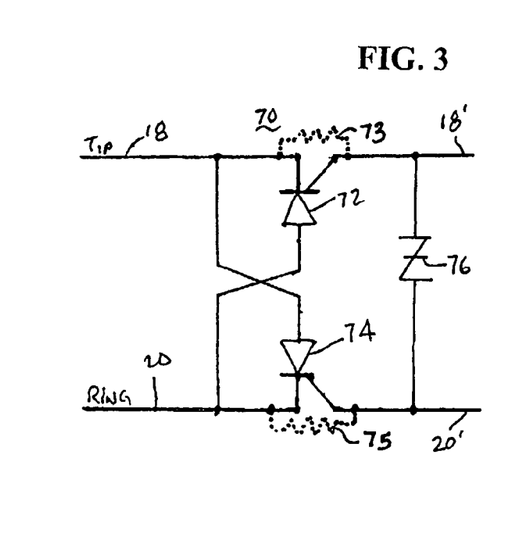
FIG. 3 is a schematic drawing of another embodiment of an overvoltage and overcurrent circuit for protecting subscriber premises equipment.

FIG. 3 illustrates another embodiment of an overvoltage and overcurrent protection circuit 70, where conventional SCR devices are employed for providing overcurrent protection, and a sidac, SIDACtor other voltage sensitive device, is employed to provide overvoltage protection. In this embodiment of the protection circuit 70, conventional SCR devices 72 and 74 can be cross coupled, much like the SCR devices 52 and 62 of FIG. 2, to the respective tip conductor 18 and the ring conductor 20 of the telephone line 14. While the SCR devices 72 and 74 are illustrated having internal resistors, the use of external gate-cathode resistors can also be employed. When using external gate-cathode resistors, such resistor components can be selected to achieve the desired threshold of overcurrent by which the SCR devices 72 and 74 will be gated into conduction. The SCR devices 72 and 74 can be off the shelf items selected with the desired holding current so that when normal telephone line operation resumes, the SCR devices 72 and 74 will not remain in the latched conduction state.

When a current in either the tip conductor 18 or the ring conductor 20 exceeds the overcurrent threshold, and when the current is flowing is a direction to bias the gate-cathode in a forward direction, the respective SCR will be driven into conduction and shunt the overcurrent to the other conductor and prevent such current from reaching the subscriber equipment. It can be appreciated that any overcurrent of whatever polarity that is flowing in the telephone line circuit, such current will flow in a direction so that at least one SCR device 72 or 74 will be forward biased and driven into conduction.

Overvoltage protection in the embodiment of FIG. 3 is achieved by the utilization of an overvoltage sensitive device 76, such as a bidirectional SIDACtor, many types of which are available under the brand name Teccor, from Littelfuse, Inc., of Des Plaines, Ill. The SIDACtor 76 can be chosen with a specified breakover voltage so that normal telephone signals, including ringing signals, can be routinely carried on the telephone line 14, but voltages that exceed such voltage represent an overvoltage and the sidac 76 conducts and clamps the overvoltage to several volts between the tip input 18' of the subscriber equipment 32 and the ring input 20'. The sidac type of overvoltage protection device 76 has a characteristic negative resistance operation so that during conduction, the voltage between the two terminals is on the order of one or two volts. The voltage sensitive device 76 can also be connected between the tip conductor 18 and the ring conductor 20 and function with equal effectiveness. Many other types of overvoltage sensitive devices and circuits are readily available in the art and can be used in the protection circuit of FIG. 3.

Figure 4:
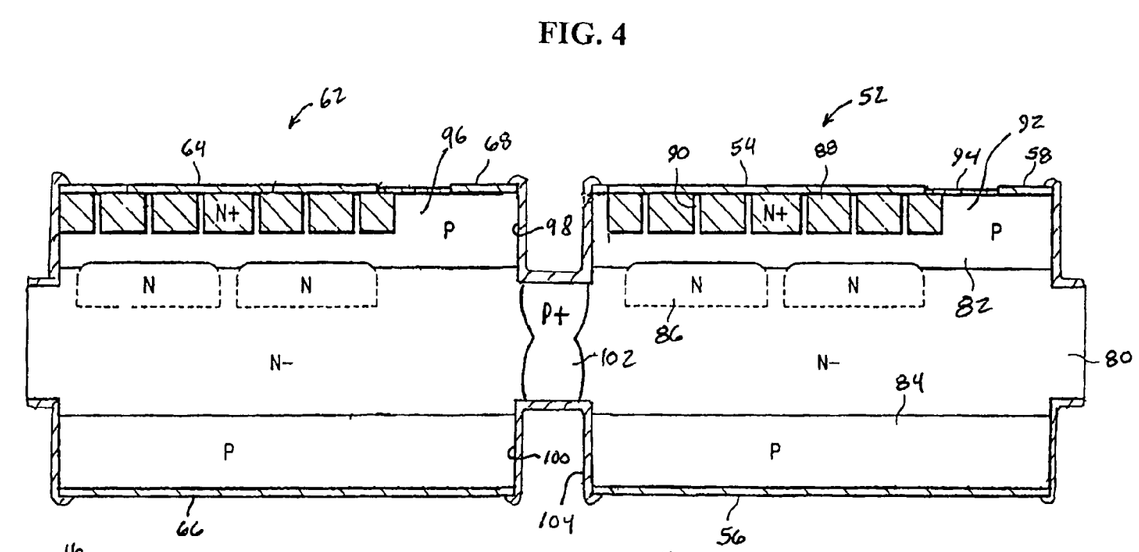
FIG. 4 is a cross-sectional view of twin SCR devices fabricated in a semiconductor chip, along with buried regions to define the breakdown voltage of the same.

FIG. 4 illustrates a twin SCR chip constructed according to an embodiment of the invention. When constructed in the manner described below, the SCR devices 52 and 62 have matched characteristics, including matched internal resistors values. The SCR device 52, shown on the right of the drawing, includes a metal cathode contact 54, a metal anode contact 56 and a metal gate contact 58. It is understood that, in practice, the metal contacts are bonded to corresponding terminals of a packaged device, such as a MS-013 six-terminal package.

The SCR devices 52 and 62 undergo the same processing steps, and thus the processing steps of only the SCR 52 will be described. The SCR devices 52 and 62 are constructed starting with a lightly doped n-type silicon wafer material, identified generally as mid-region 80. An upper p-type base region 82 is formed in the top of the mid-region 80. Similarly, a lower p-type base region 84 is formed in the lower face of the semiconductor mid-region 80. A plurality of n-type buried regions, one shown as reference numeral 86, are formed in the wafer. The buried regions 86 are formed by ion implant techniques to provide a dopant concentration that is a function of the breakover voltage desired in the overvoltage protection portion of the SCR device 52. Following the ion implant of an n-type dopant into the masked regions, the dopant is driven deeply into the wafer by a standard high temperature diffusion process. The ion implant is carried out by driving the n-type ions into the wafer 80 from the top thereof. Because of the depth and concentration of the dopants implanted in the silicon wafer, the high temperature diffusion process may require up to ten days, or more, to complete. An upper p-type base region 82 is formed in the top of the mid-region 80. Similarly, a lower p-type base region 84 is formed in the lower face of the semiconductor mid-region 80. The upper p-type base region 82 and the lower p-type base region 84 are formed at the same time. The p-type upper base 82, when formed, substantially overcomes the impurity type of the upper part of the n-type buried regions 86. A heavily doped n+ emitter 88 is then formed in the upper surface of the upper base regions 82, overlying the buried regions 86. Formed within the emitter region 88 are a number of shorting dots 90, which allow small pillars of the upper base 82 to extend through the emitter 88 to the surface thereof. While the emitter 80 appears in the drawing as individual islands, the emitter 88 is in practice a single larger semiconductor region perforated by the pillars or shorting dots 90 formed therein through which the pillars of the p-type material of the upper base 82 extends. The shorting dots 90 effectively lower the gate sensitivity so that larger gate currents are required to trigger the SCR device 52 into conduction.

The geometry of the emitter 88 determines the various electrical parameters of the SCR device 52. The cross-sectional area and the number of shorting dots 90 define, in part, the holding current and the switching current of the SCR device 52. The right edge of the emitter 88 is shown extending beyond the edge of the cathode contact 54. A portion of the emitter 88 that extends laterally beyond an edge of the metal cathode contact 54 can be formed with a number of edge slots (not shown). The slots can have a width and length suitable for adjusting the shunt resisitivity to achieve a desired trigger level of gate current. The left edge of the gate metal contact 58 is spaced from right edge of the cathode contact 54. The doped semiconductor material between the gate contact 58 and the cathode contact 54 defines the internal resistor 92, together with the geometry of the right hand portion of the emitter 88 and the shorting dots 90. As noted above, the internal resistor 92 between the gate contact 58 and the cathode contact 54 is a low value resistor that sets the threshold value of overcurrent necessary to trigger the SCR device 52 into conduction. In one embodiment of the invention, the internal resistor has a value of about 40 ohm, so that overcurrents exceeding about 20 milliamps trigger the SCR device 52 into conduction. For other overcurrent thresholds, the value of the internal resistor 92 can be changed during processing or design to achieve different threshold values of overcurrent.

The semiconductor regions generally underlying the cathode contact 54 relate to a two-terminal overvoltage protection device that has a breakover voltage that is generally a function of the doping concentration of the buried regions 86. With higher dopant concentrations, the anode-cathode breakover voltage of the device 52 is lower. Importantly, once the breakover voltage impressed across the anode contact 56 and the cathode contact 54 is exceeded, the device enters into a negative resistance conduction mode between such contacts, irrespective of any current thorough the internal resistor 92. The semiconductor regions generally below the gate contact 58 provide a gating function that is responsive to the magnitude of current that flows through the internal resistor 92 to drive the overvoltage portion of the device into conduction. In other words, once a current flowing through the internal resistor 92 exceeds a specified magnitude, the resulting electrons that are generated provide the current necessary to forward bias the emitter 88, thus driving the SCR device 52 into conduction. A more detailed description of a dual function device, albeit a bidirectional triac device, is set forth in U.S. Pat. No. 6,407,901, the disclosure of which is incorporated herein by reference.

During fabrication of the dual SCR chip, the gate contact 58 is isolated from the cathode contact 54 by a suitable insulating material 94. The first SCR device 52 is electrically isolated from the second SCR 62 by respective trenches 98 and 100 and a heavily doped p+ isolation region 102 formed between the trenches 98 and 100. A pn junction thus separates the two SCR devices 52 and 62 so that independent electrical operation can be realized. The trenches 98 and 100 are covered with a conventional passivation 104, such as leadaluminoborosilicate glass. The outer peripheral edge of the dual SCR chip is also passivated with such glass material.

With reference back to FIGS. 2 and 3, it is noted that normal telephone line current flows through the gate-cathode terminals of the SCR devices 52 and 62. This telephone line current flow is not through a junction of such devices, and thus is generally linear due to the resistivity of the upper base region 82. The normal line current flows through the gate contact 58, through the semiconductor material of the upper base region 82, through the shorting dots 90 of the upper base region 82 and through the cathode contact 54. Thus, the typical line current of the telephone line 14 does not flow through a junction and thus no nonlinear behavior is presented to the telephone circuit by the protection circuit 44. The same line current that flows through the first SCR 52 also flows through the second SCR 62. Moreover, such current flows through the internal resistors 92 of the first SCR 52 and through the internal resistor 96 of the second SCR 62. By fabricating both such resistors in the same semiconductor chip 80, in the same face of the chip 80, by the same process, the internal resistors 92 and 96 are matched in value to a very close tolerance. As such, the longitudinal balance of the telephone tip conductor 18 and the ring conductor 20 remain unaffected by the presence of the protection circuit 44. In the fabrication of the dual SCR device, different batches or runs of semiconductor wafers can be made using different parameters to achieve different standard internal resistor values to satisfy the general needs of customers.

The effective value of the gate-cathode resistor can also be varied by bridging a discrete resistor across the gate terminal 58 and the cathode terminal 54 to effectively reduce the value of the internal resistor 92. The internal series semiconductor resistor 92 establishes the minimum gate current for turn on of the SCR device 52, and when bridged with a discrete resistor, a maximum gate current is established. Thus, when it is desired to provide a turn-on current that is higher than when using the internal resistor alone, a discrete resistor of the desired value can be bridged across the gate and cathode terminals 58 and 54 of the semiconductor thyristor chip. By employing both a semiconductor resistor and a discrete resistor in parallel, the overall thermal coefficient of resistance is usually decreased, as a discrete resistor has a resistance value that is more stable with temperature changes, as compared to a semiconductor resistor.

While the preferred embodiment of the invention contemplates the use of a dual SCR chip, those skilled in the art may prefer to employ individual SCR device chips, and such choice is within the ambit of the invention. Also, the use of a dual function SCR is not entirely necessary to the practice of the invention, as conventional SCR devices can be employed. In other words, with conventional single function SCR devices, both the overvoltage and overcurrent operation of such devices relies solely on a current through a resistor to drive the device into conduction. Stated another way, with a conventional SCR device, both an overvoltage or an overcurrent, or both, impressed on the telephone line 14 produces an overcurrent which passes through the gate-cathode resistor to drive the device into conduction. However, the dual function SCR device of FIG. 2 includes an overvoltage protection function directly integrated with an overcurrent protection function, and thus achieves the overvoltage protection function much faster, as there is no propagation delay as would occur in the circuit of FIG. 3. Those skilled in the art may also prefer to employ a discrete gate-cathode resistor external to the SCR chip of the invention to decrease the total sensing resistance in the telephone line 14. The discrete resistors 73 and 75 are shown in broken lines in FIG. 3. Both external discrete and internal semiconductor current sensing resistors can be utilized. While such choice may reduce the longitudinal balance of the telephone line 14 due to differences in the resistor values, the resistor value can be chosen to provide a wide latitude in achieving different overcurrent thresholds.

Central Office End Protection

The occurrence of electrical disturbances on the telephone line 14 can also damage subscriber line interface circuits 16 and associated circuits in the central office 10. The electrical energy imparted to the conductor(s) of a telephone line 14 during either a lightning strike or a power line cross, propogates both directions on the line 14 and can damage equipment connected to both ends of the telephone line 14. Thus, protection at one end of the telephone line 14 will not reliably protect the equipment at the other end of the line 14. Overvoltage and overcurrent protection provided at both ends of the telephone line 14 is thus a prudent measure to be taken. Generally, a number of SLICs 16 are provided on a printed circuit board to provide the routine services to the respective telephone lines. The SLIC circuits include integrated circuits, often including operational amplifiers that drive the tip and ring conductors 18 and 20 with the voice, data and other signals. As such, the SLIC circuits 16 require protection from overvoltage and overcurrent conditions occurring on the telephone line 14. A generic protection circuit 28 shown in FIG. 1 is situated between the telephone line 14 and the SLIC 16. Because the central office 10 is equipped with an electrical ground, the protection circuit 28 utilizes the ground to shunt overcurrents thereto and away from sensitive circuits, and to clamp overvoltages with respect to the ground potential.

Figure 5:
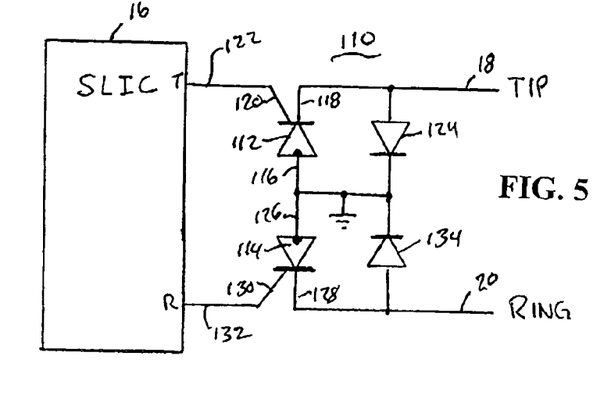
FIG. 5 is a schematic drawing of one embodiment of an overvoltage and overcurrent circuit for protecting central office SLIC equipment.

A versatile and cost effective protection circuit 110 is shown in FIG. 5. The telephone line protection circuit 110 includes a first SCR device 112 and a second SCR device 114, both constructed in an identical manner, and preferably on the same semiconductor chip. The first SCR device 112 includes an anode terminal 116 that is grounded, and a cathode terminal 118 that is connected to the telephone line tip conductor 18. A gate terminal 120 of the SCR device 112 is connected to the tip input 122 of the SLIC 16. A diode 124 has an anode connected to the telephone line tip conductor 18, and a cathode that is grounded. The diode 124 provides positive polarity overvoltage protection to the tip conductor 18 of the telephone line 14, and circuits connected to the SLIC 16 via the tip input 122.

Figure 8:
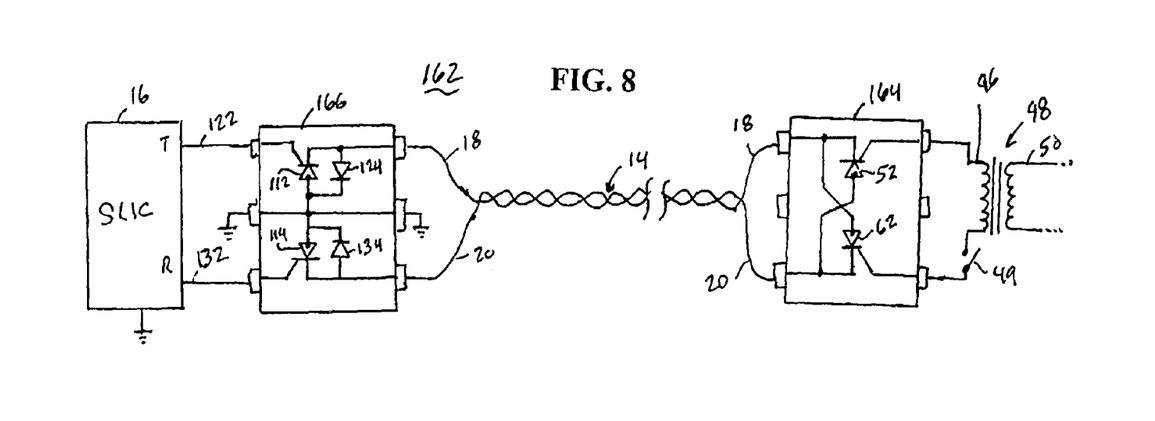
FIG. 8 is a diagram of a telephone line circuit provided with customer end and central office end protection circuits encompassed in two integrated circuits.

The second SCR device 114 has a cathode terminal 128 connected to the telephone line ring conductor 20, and an anode 126 that is grounded. The gate terminal 130 of the second SCR device 114 is connected to the ring input 132 of the SLIC 16. A diode 134 has an anode connected to the telephone line ring conductor 20, and a cathode that is grounded. The diode 134 provides positive polarity overvoltage protection to the ring conductor 20 and the circuits connected to the SLIC 16 via the ring input 132. While not shown, the diodes 124 and 134 can be integrated in the same semiconductor chip as the SCR devices 112 and 114 so that all four semiconductor components are available in a single chip. FIG. 8 illustrates the connection of such chips in the telephone line system of the example.

The SCR devices 112 and 114 are preferably constructed in a manner similar to the SCR devices 52 and 62 described above in connection with the customer end protection circuit 44. To that end, the SCR devices 112 and 114 preferably include the dual, independent function of overcurrent and overvoltage protection, where the buried regions generally dictate the breakover voltage between the anode terminal 116 and the cathode terminal 118. When the device 112 exceeds its breakover voltage, it exhibits a negative resistance so that the anode-cathode voltage of the device 112 is on the order of a couple of volts, or less. The voltage sensitive nature of the SCR devices 112 and 114 is denoted by the darkened dot in the triangular symbol near the anode terminals.

As noted above, the output stage of the SLIC circuit is not well adapted for sourcing current, and may indeed be damaged by such action. Thus, it is important to prevent external sources from forcing the SLIC circuit from sourcing current. The second SCR device 114 is connected in the ring conductor 20 so that when the negative terminal of the central office SLIC driver 27 sources current, the SCR device 114 is forward biased and is driven into conduction. The current is then sourced from ground, through the anode and cathode of the SCR device 114, and not from the SLIC circuit driver 27, to the ring conductor 20 (to the right in FIG. 5) of the telephone line 14. Similarly, if a large negative overvoltage is impressed on the ring conductor 20, which would otherwise also cause the negative central office supply 26 to source current, the breakover voltage is exceeded and the second SCR device 114 is driven into conduction to thereby clamp the overvoltage to a few volts above ground. For positive polarity overvoltages on the ring conductor 20, the diode 134 clamps such overvoltages to about one junction drop above ground. In this condition, the SLIC circuit is prevented form sinking unacceptably large currents.

In the event a power line comes into contact with the telephone line 14, then high voltages of positive and negative polarity are impressed on one or both of the telephone line conductors 18 and 20. In this situation, if a 120 volt, 60 cycle voltage is applied to the tip conductor 18, the diode 124 will conduct on the positive polarity half cycles, and the SCR device 112 will conduct on the negative half cycles of the AC voltage. The same action is carried out by the central office end protection circuit 110 when the AC voltage is inadvertently coupled to the ring conductor 20, except the diode 134 will conduct on the positive half cycles and the SCR device 114 will conduct on the negative half cycles. Other telephone line overvoltage scenarios can exist, for example, in which both the tip conductor protection diode 124 will conduct together with the ring conductor SCR device 114, and vice versa.

The protection circuit 110 of FIG. 5 utilizes SCR devices 112 and 114 that are constructed to be sensitive to both overcurrents and overvoltages. Such devices 112 and 114 can be constructed in the same manner as set forth above in connection with FIG. 4 so that matched electrical and resistive characteristics can be realized. Again, the principles and concepts of the invention do not require an SCR device that is sensitive to overvoltages in addition to overcurrents. Conventional SCR devices that are only sensitive to overcurrents can be utilized, such as shown in the protection circuit 140 of FIG. 6. Here, conventional SCR devices 142 and 144 are cross coupled across the tip conductor 18 and the ring conductor 20 in the same manner as the SCR devices 112 and 114 shown in FIG. 5. The conventional SCR devices 142 and 144 are illustrated as having internal gate-cathode resistors, but external discrete gate-cathode resistors can be employed also, as shown by reference numerals 143 and 145. The gate-cathode resistors, whether internal or external, or both, should be as nearly matched in value as practical to maintain the longitudinal balance of the telephone line 14. In addition, the resistor value will determine the magnitude of the current that can be tolerated in the telephone line 14 before the respective SCR devices 142 or 144 will be driven into conduction. The SCR devices 142 and 144 function to sense overcurrents passing through the gate-cathode resistors for driving the respective SCR devices into conduction and shunting such overcurrents to ground.

Figure 6:
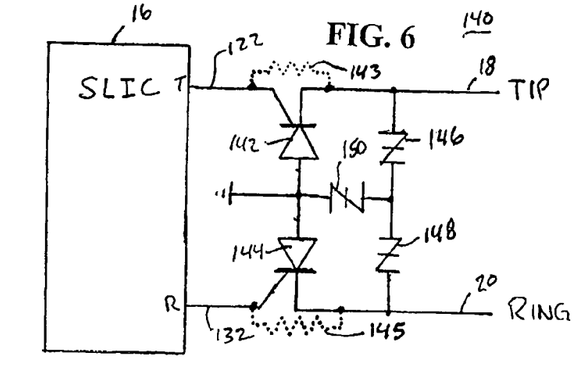
FIG. 6 is a schematic drawing of another embodiment of an overvoltage and overcurrent circuit for protecting central office SLIC equipment.

The overvoltage protection function of the circuit 140 is provided by a network of voltage sensitive devices 146, 148 and 150. The overvoltage sensitive devices are preferably bidirectional SIDACtor devices, arranged in the manner shown in U.S. Pat. No. 4,905,119 by Webb, the disclosure of which is incorporated herein by reference. With this overvoltage protection scheme, there is afforded overvoltage protection between the tip conductor 18 and the ring conductor 20, as well as between each such conductor 18 and 20 and ground. The overvoltage threshold can be controlled by choosing the breakover voltage of each of the devices 146, 148, and 150 which will generally have the same breakover voltage. For example, if a 220 volt overall breakover voltage is desired, then each voltage sensitive device 146, 148 and 150 can have an individual breakover voltage of about 110 volts. In this manner, the overvoltage threshold between the tip conductor 18 and the ring conductor 20 is 220 volts, and the overvoltage threshold between each conductor 28 and 20 and ground is also 220 volts. While three voltage sensitive devices are illustrated in FIG. 6, other arrangements, configurations and types of voltage sensitive devices and circuits can be employed.

Figure 7:
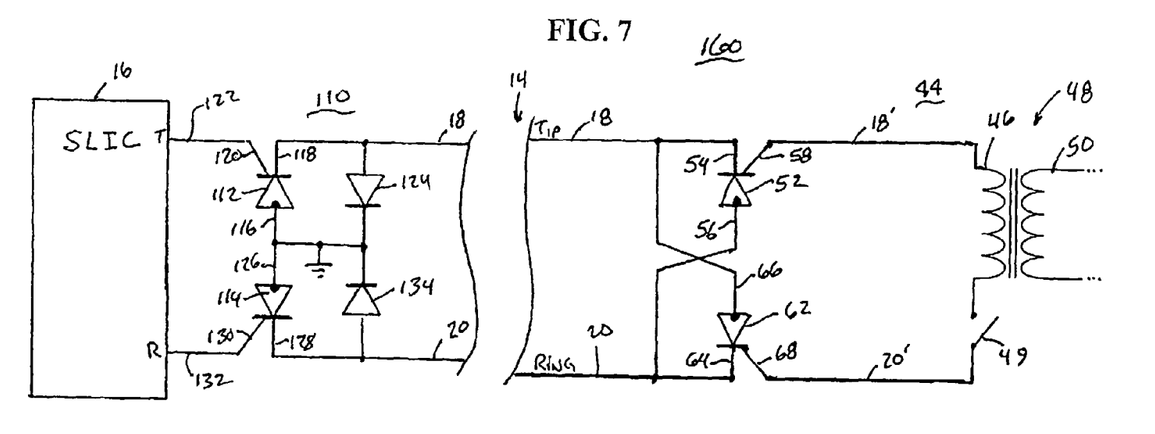
FIG. 7 is a schematic drawing of a simplified telephone line system employing both customer premises end protection of the invention, and central office end protection of the invention.

FIG. 7 illustrates a telephone line system 160 employing protection at both ends of the telephone line 14. It is to be understood that while the customer premises protection provided by the protection circuits 44 and 70 of FIG. 2 or 3 above can be utilized with many other types of central office protection schemes, it is preferable that the central office protection circuits of FIGS. 5 or 6 be employed. Similarly, the central office protection circuits of FIG. 5 or 6 can be utilized with many other customer premises protection schemes, but it is preferable that the customer premises protection circuits of FIG. 2 or 3 be employed. FIG. 7 illustrates the use of the customer premises protection circuit 44 of FIG. 2 with the central office protection circuit 110 of FIG. 5.

It is noted that the tip conductor 18 of the telephone line 14 is connected to the cathode 54 of the customer end SCR device 52, and is connected to the cathode 118 of the central office end SCR device 112. Similarly, the ring conductor 20 is connected to the cathode 64 of the customer end SCR device 62, and is also connected to the cathode 128 of the central office end SCR device 114. The telephone line 14 may be up to 15,000 feet long, and thus the customer protection circuit 44 may also be spaced from the central office protection circuit 110 by a similar distance. A lightning strike or AC power line cross can occur at any location along the telephone line 14. Thus, either or both of the protection circuits 44 or 110 can be triggered to suppress the overvoltage and/or overcurrent resulting therefrom.

It can be seen from the foregoing that in response to an overvoltage or overcurrent on the telephone line 14, the energy surge will propogate both directions on the telephone line 14 and will be suppressed by both the customer end protection circuit 44 and the central office end protection circuit 110. Other scenarios exist as to the various operational modes of the protection circuits 44 and 110, when the hook switch 49 is open and closed. Nevertheless, the many features and advantages of the protection circuits 44 and 110 described above, and others, are realized.

According to the features of the invention, both the customer end equipment 32 and the central office end SLIC circuits 16 are provided full overcurrent and overvoltage protection by the utilization of two protection circuits 44 and 110, and the sum total of components may be as few as two-two dual SCR integrated circuit chips, where one chip has integrated therein the two diodes. This cost effective configuration 162 of components illustrated in FIG. 8 is easily implemented, requires little space, and is reliable in operation. The first integrated circuit 164 includes the customer end protection circuit 44 with a pair of dual function SCR devices 52 and 62. The second integrated circuit 166 includes the central office end protection circuit 110 with the pair of dual function SCR devices 112 and 114 and the associated diodes 124 and 134. The simplicity of the design in providing full protection at both ends of a telephone line 14 is readily apparent. In the event that it is desired to manufacture only a single chip with SCR devices therein so as to be usuable at both the customer end and the central office end, then two identical SCR chips can be used, and two discrete diodes, or an additional chip with the two diodes fabricated therein. Even with this configuration, the protection circuits of the invention can be incorporated into existing telephone circuits and realize a significant efficiency in space, cost and reliability.

From the foregoing, disclosed are various embodiments of protection circuits for both the customer premises equipment, as well as the central office SLIC circuits. It should be understood that while the preferred embodiments contemplate the use of such protection circuits in connection with telephone lines, SLIC circuits, transformers, etc., such environment is not necessary to the practice of the invention. The protection circuits of the invention can be utilized with equal effectiveness with other lines, such as other communication lines, fire alarm lines and a host of other types of lines that may carry signals and power. In other words, the type of conductor or conductors to be protected by the invention does not limit the application of the invention.

While the preferred and other embodiments of the invention have been disclosed with reference to specific protection devices and circuits, and associated methods thereof, it is to be understood that many changes in detail may be made as a matter of engineering choices without departing from the spirit and scope of the invention, as defined by the appended claims.

What is claimed is:

1. A method of protecting an electrical circuit from overcurrents, where the electrical circuit is connected between a tip conductor and a ring conductor, comprising the steps of:
providing a first current sensing resistance for connection in series with the tip conductor;
providing a second current sensing resistance for connection in series with the ring conductor;
providing a first gated unidirectional thyristor having a gate terminal in a silicon substrate, a cathode terminal and an anode terminal connected between the tip conductor and a ground;
providing a second gated unidirectional thyristor in the silicon substrate and electrically isolated from the first gated unidirectional thryristor by at least two substantially unfilled trenches in the silicon substrate and an isolation region sandwiched between the trenches, the second gated unidirectional thyristor having a gate terminal, a cathode terminal and an anode terminal connected between the ring conductor and the ground;
sensing current passing through said first current sensing resistance to develop a corresponding voltage across said first resistance, where the current passing through said first resistance also passes through the tip conductor, and applying the voltage across said first resistance between the gate terminal and the cathode terminal of said first gated unidirectional thyristor; and
sensing current passing through said second current sensing resistance to develop a corresponding voltage across said second resistance, where the current passing through said second resistance also passes through the ring conductor, and applying the voltage across said second resistance between the gate terminal and the cathode terminal of said second gated unidirectional thyristor.

2. The method of claim 1, further including providing overvoltage protection to the tip conductor and to the ring conductor so that an overvoltage on the tip conductor and an overvoltage on the ring conductor are clamped to desired levels.

3. The method of claim 1, further including providing said overvoltage protection in said first and second gated unidirectional thyristors using voltage sensitive semiconductor regions responsive to respective breakover voltages to drive said first and second gated unidirectional thyristors into conduction.

4. The method of claim 3, further including using one or more buried regions in each said first and second gated thyristors to define the respective breakover voltages.

5. The method of claim 1, further including providing the overvoltage protection using one or more voltage sensitive semiconductor devices which exhibit negative resistance characteristics, and connecting the voltage sensitive semiconductor devices to the tip conductor and the ring conductor.

6. The method of claim 5, further including providing a respective diode coupled across the cathode and anode of said first and second gated unidirectional thyristors to provide overvoltage protection for positive polarity overvoltages.

7. The method of claim 6, further including integrating said diodes into respective semiconductor chips in which said first and second gated unidirectional thyristors are formed.

8. The method of claim 6, further including connecting the cathodes of said diodes together to define a junction, and connecting the anodes of said first and second gated unidirectional thyristors to said junction.

9. The method of claim 8, further including grounding the junction.

10. The method of claim 1, further including shunting the overcurrents to a ground.

11. The method of claim 1, further including providing the first resistance as a semiconductor resistor in a chip in which said first gated unidirectional thyristor is formed, and providing the second resistance as a semiconductor resistor in a chip in which said second gated unidirectional thyristor is formed.

12. The method of claim 11, further including providing said first and second current sensing resistances and said first and second gated unidirectional thyristors in a single semiconductor chip so as to achieve matched electrical characteristics between said first and second semiconductor resistors and said first and second gated unidirectional thyristors.

13. The method of claim 1, further including using resistance values of said first current sensing resistance and said second current sensing resistance so that the first predetermined threshold is substantially equal to the second predetermined threshold.

14. The method of claim 1, further including using a first SCR device as said first gated unidirectional thyristor, and using a second SCR device as said second gated unidirectional thyristor.

15. The method of claim 1, further including connecting first and second gated unidirectional thyristors in the respective tip and ring conductors so that the same series current flowing in both said tip-and ring conductors in one direction forward biases said first gated unidirectional thyristor and reverse biases said second gated unidirectional thyristor.

16. The method of claim 1, wherein if an overcurrent flowing in the tip conductor is greater than a first predetermined threshold and flowing in a first direction in the tip conductor, using the corresponding voltage across said first resistance to forward bias said first gated unidirectional thyristor into conduction to thereby shunt the overcurrent from the tip conductor via the cathode terminal and the anode terminal of said first gated unidirectional thyristor.

17. The method of claim 1, wherein if an overcurrent flowing in the tip conductor is greater than the first predetermined threshold but flowing in a second direction in the tip conductor, using the corresponding voltage across said first resistance to reverse bias said first gated unidirectional thyristor and prevent conduction between the cathode terminal and the anode terminal of said first gated unidirectional thyristor.

18. The method of claim 1, wherein if an overcurrent flowing in the ring conductor is greater than a second predetermined threshold and flowing in a first direction in the ring conductor, using the corresponding voltage across said second resistance to forward bias said second gated unidirectional thyristor into conduction to thereby shunt the overcurrent from the ring conductor via the cathode terminal and the anode terminal of said second gated unidirectional thyristor.

19. The method of claim 1, wherein if an overcurrent flowing in the ring conductor is greater than the second predetermined threshold but flowing in a second direction in the ring conductor, using the corresponding voltage across said second resistance to reverse bias said second gated unidirectional thyristor and prevent conduction between the cathode terminal and the anode terminal of said second gated unidirectional thyristor.

20. The method of claim 1, wherein the at least two substantially unfilled trenches comprise an upper trench and a lower trench, the upper trench located above the lower trench.

21. A protection circuit for protecting a telephone line circuit connected to a tip conductor and a ring conductor, the protection circuit comprising:
a first and second unidirectional thyristor, each said first and second thyristor having a gate, cathode and anode;
said first and second unidirectional thyristors each having a gate-cathode resistance formed in a semiconductor chip in which the respective thyristors are constructed and being electrically isolated from each other by at least two substantially unfilled trenches in the semiconductor chip and an isolation region sandwiched between the trenches;
a cathode and anode of said first unidirectional thyristor connected to couple the tip conductor to ground when said first unidirectional thyristor is driven into conduction;
a cathode and anode of said second unidirectional thyristor connected to couple the ring conductor to ground when said second unidirectional thyristor is driven into conduction;
a first diode having an anode connected to the cathode of said first gated unidirectional thyristor, and said first diode having a cathode connected to the anode of said first gated unidirectional thyristor, said first diode providing overvoltage protection for positive polarity overvoltages; and
a second diode having an anode connected to the cathode of said second gated unidirectional thyristor, and said second diode having a cathode connected to the anode of said second gated unidirectional thyristor, said second diode providing overvoltage protection for positive polarity overvoltages.

22. The protection circuit of claim 21, wherein said first and second unidirectional thyristors are each constructed with buried regions to define respective cathode-anode breakover voltages so that an overvoltage on the telephone tip or ring conductor causes a respective said first or second gated unidirectional thyristor to be driven into conduction irrespective of a gate current.

23. The protection circuit of claim 21, wherein the gate-cathode resistance of said first and second unidirectional thyristor connected in series with the respective telephone line tip and ring conductors and in series with the telephone line circuit to be protected, said gate-cathode resistances arranged so that when a series current flows in one direction in the telephone line tip and ring conductors, a gate of said first thyristor is forward biased by the series current and a gate of said second thyristor is reverse biased by the series current.

24. The protection circuit of claim 21, wherein the at least two substantially unfilled trenches comprise an upper trench and a lower trench, the upper trench located above the lower trench.

25. A protection circuit for protecting a telephone line circuit connected to a tip conductor and a ring conductor, the protection circuit comprising:
a first and second unidirectional thyristor, each said first and second unidirectional thyristor having a gate, cathode and anode;
said first and second unidirectional thyristors each having a gate-cathode resistance formed in a semiconductor chip in which the respective thyristors are constructed and being electrically isolated from each other by a first substantially unfilled trench in the semiconductor chip, a second substantially unfilled trench in the semiconductor chip and an isolation region sandwiched between the first and second trenches;
a cathode and anode of said first unidirectional thyristor connected to couple the tip conductor to ground when the first unidirectional thyristor is driven into conduction;
a cathode and anode of said second unidirectional thyristor connected to couple the ring conductor to ground when the second unidirectional thyristor is driven into conduction;
the gate of said second gated unidirectional thyristor adapted for connection to a negative voltage SLIC driver; and
a second diode having an anode connected to the cathode of said second gated unidirectional thyristor, and said second diode having a cathode connected to the anode of said second gated unidirectional thyristor, said second diode providing overvoltage protection for positive polarity overvoltages.

26. The protection circuit of claim 25, wherein the gate-cathode resistance of said first and second unidirectional thyristors connected in series with the respective telephone line tip and ring conductors and in series with the telephone line circuit to be protected, said gate-cathode resistances arranged so that when a series current flows in one direction in the telephone tip and ring conductors, a gate of said first thyristor is forward biased by the series current and a gate of said second thyristor is reverse biased by the series current.

27. The protection circuit of claim 25, wherein said first and second unidirectional thyristors are each constructed with buried regions to define respective cathode-anode breakover voltages so that an overvoltage on the telephone tip or ring conductor causes a respective said first or second gated unidirectional thyristor to be driven into conduction irrespective of a gate current; and a first diode having an anode connected to the cathode of said first gated unidirectional thyristor, and said first diode having a cathode connected to the anode of said first gated unidirectional thyristor, said first diode providing overvoltage protection for positive polarity overvoltages.

28. The protection circuit of claim 25, wherein the first substantially unfilled trench is positioned above the second substantially unfilled trench.

* * * * *